(12) United States Patent
Shaul et al.

(10) Patent No.: US 10,412,854 B1
(45) Date of Patent: Sep. 10, 2019

(54) RESTRAINING DATA CENTER EQUIPMENT

(71) Applicant: Google LLC, Mountain View, CA (US)

(72) Inventors: Kenneth Dale Shaul, Sunnyvale, CA (US); Thomas R. Kowalski, Santa Cruz, CA (US); Gary Joseph Hensley, Hayward, CA (US); Soheil Farshchian, San Jose, CA (US); Pascal Kam, Union City, CA (US)

(73) Assignee: Google LLC, Mountain View, CA (US)

( * ) Notice: Subject to any disclaimer, the term of this patent is extended or adjusted under 35 U.S.C. 154(b) by 274 days.

(21) Appl. No.: 14/853,561

(22) Filed: Sep. 14, 2015

(51) Int. Cl.
  *H05K 7/14* (2006.01)
  *H05K 7/18* (2006.01)

(52) U.S. Cl.
  CPC ......... *H05K 7/1495* (2013.01); *H05K 7/1474* (2013.01); *H05K 7/183* (2013.01)

(58) Field of Classification Search
  CPC .. H05K 7/1485; H05K 7/1488; H05K 7/1495; H05K 7/1474; H05K 7/183; H05K 7/186
  USPC .............. 248/637, 638, 670, 672; 312/351.7, 312/351.1, 351.2, 223.2
  See application file for complete search history.

(56) References Cited

U.S. PATENT DOCUMENTS

| | | | | | |
|---|---|---|---|---|---|
| 1,609,939 | A | * | 12/1926 | Gehrung | B60K 5/10 248/224.51 |
| 1,652,159 | A | * | 12/1927 | Baker | B60K 5/12 180/291 |
| 2,323,153 | A | * | 6/1943 | Pilson | H02K 5/00 248/222.51 |
| 2,368,727 | A | * | 2/1945 | Robinson | F16F 1/3732 248/580 |
| 3,090,586 | A | * | 5/1963 | Schwegler | D06F 37/22 210/364 |
| 3,112,016 | A | * | 11/1963 | Peterson | B06B 1/186 248/228.6 |
| 3,190,041 | A | * | 6/1965 | Kimball | F16M 7/00 248/637 |
| 3,819,245 | A | * | 6/1974 | Tacke | A47B 46/00 312/257.1 |
| 4,081,163 | A | * | 3/1978 | Guinn | E21B 3/045 173/165 |
| 4,362,289 | A | * | 12/1982 | Meade | B22D 31/007 248/656 |

(Continued)

FOREIGN PATENT DOCUMENTS

WO   WO2006039885 A1   4/2006

*Primary Examiner* — Michael Safavi
(74) *Attorney, Agent, or Firm* — Fish & Richardson P.C.

(57) ABSTRACT

A server rack seismic restraint includes a rear restraint assembly configured to attach to a support surface that is operable to support a data center server rack. The rear restraint assembly includes at least one lateral member positioned to receive the server rack and restrain the server rack against lateral movement based on a force applied to the server rack; and an angled bracket positioned to receive the server rack and restrain the server rack against vertical movement based on the force applied to the server rack. The server rack seismic restraint also includes a front restraint assembly configured to attach to the support surface and engage the server rack to restrain the server rack against vertical movement based on the force applied to the server rack.

18 Claims, 7 Drawing Sheets

(56) References Cited

U.S. PATENT DOCUMENTS

| | | | | |
|---|---|---|---|---|
| 5,014,961 | A | * | 5/1991 | Ferguson ................ E01H 5/066 |
| | | | | 248/670 |
| 5,176,437 | A | * | 1/1993 | Remington ............ A47B 91/08 |
| | | | | 248/500 |
| 5,460,348 | A | * | 10/1995 | Cox ........................ F16M 5/00 |
| | | | | 248/237 |
| 5,697,586 | A | * | 12/1997 | Lybarger ............... D06F 39/125 |
| | | | | 248/188.2 |
| 6,134,858 | A | | 10/2000 | Gutelius et al. |
| 6,155,660 | A | | 12/2000 | Nicolai |
| 6,634,615 | B1 | | 10/2003 | Bick et al. |
| 6,691,974 | B2 | * | 2/2004 | Ku .......................... E02D 27/44 |
| | | | | 248/638 |
| 7,290,375 | B2 | | 11/2007 | Kemeny |
| 7,477,514 | B2 | | 1/2009 | Campbell et al. |
| 7,660,121 | B2 | | 2/2010 | Campbell et al. |
| 8,528,875 | B2 | * | 9/2013 | Wilson, Jr. ................ F24F 1/60 |
| | | | | 248/188.1 |
| 8,616,517 | B2 | * | 12/2013 | Huth .................... F01D 17/162 |
| | | | | 248/188.1 |
| 8,659,905 | B2 | | 2/2014 | Knoop |
| 2004/0174105 | A1 | * | 9/2004 | Hung .................... A47B 91/02 |
| | | | | 312/351.1 |
| 2004/0263035 | A1 | * | 12/2004 | Lim ....................... F25D 23/00 |
| | | | | 312/351.1 |
| 2006/0023416 | A1 | * | 2/2006 | Chen .................... G06F 1/1613 |
| | | | | 361/679.4 |
| 2011/0222800 | A1 | | 9/2011 | Hubbard et al. |
| 2012/0090869 | A1 | | 4/2012 | Bumeder et al. |
| 2012/0305356 | A1 | | 12/2012 | Sato |
| 2013/0106114 | A1 | * | 5/2013 | Wang ..................... F16F 15/04 |
| | | | | 290/1 A |

* cited by examiner

RESTRAINING DATA CENTER EQUIPMENT

TECHNICAL FIELD

This document relates to systems and methods for restraining data center equipment, such as computer server racks and related equipment in computer data centers.

BACKGROUND

Computer data center equipment often must withstand external forces, such as seismic forces and otherwise. Often, restraining computer data center equipment, such as server racks, against seismic events requires substantial high strength brackets arranged with an optimal geometry. As the equipment rack weight and center of gravity height increases, so must the bracket strength requirement. Conventional restraint systems, therefore, may utilize a structure that is at least as tall as the server rack, thereby increasing costs and decreasing space availability which could otherwise be used for more racks. In addition, data center server racks may be mobile, thereby increasing the challenge of restraining the racks during a seismic event.

SUMMARY

In an example implementation, a server rack seismic restraint includes a rear restraint assembly configured to attach to a support surface that is operable to support a data center server rack. The rear restraint assembly includes at least one lateral member positioned to receive the server rack and restrain the server rack against lateral movement based on a force applied to the server rack; and an angled bracket positioned to receive the server rack and restrain the server rack against vertical movement based on the force applied to the server rack. The server rack seismic restraint also includes a front restraint assembly configured to attach to the support surface and engage the server rack to restrain the server rack against vertical movement based on the force applied to the server rack.

In a first aspect combinable with the example implementation, the angled bracket is positioned to interface with the rear portion of the server rack to restrain the server rack against rotational movement based on the force applied to the server rack.

In a second aspect combinable with any of the previous aspects, the rear restraint assembly further includes a rear bracket attachable to the support surface.

In a third aspect combinable with any of the previous aspects, the at least one lateral member includes two lateral members coupled with the rear restraint assembly at a distance apart to receive a width of the server rack.

In a fourth aspect combinable with any of the previous aspects, each of the lateral members includes a protrusion that extends from the rear restraint assembly to engage either a mating bracket attached to the rack or a side portion of the server rack.

In a fifth aspect combinable with any of the previous aspects, each of the lateral members is independently attachable to the rear restraint assembly at a plurality of unique positions.

In a sixth aspect combinable with any of the previous aspects, the front restraint assembly includes an anchor channel embeddable in the support surface.

In a seventh aspect combinable with any of the previous aspects, the support surface includes a concrete slab.

In an eighth aspect combinable with any of the previous aspects, the front restraint assembly further includes a front bracket coupled to the anchor channel; and one or more shim plates coupled to the front bracket and adjustable to flush mount against a portion of the server rack to restrain the server rack against vertical movement and rotational movement based on the force applied to the server rack.

In a ninth aspect combinable with any of the previous aspects, each of the rear restraint assembly and front restraint assembly is detached from the server rack.

In a tenth aspect combinable with any of the previous aspects, the force includes a seismic force.

In another example implementation, a method of installing a server rack in a data center includes moving a server rack adjacent a rear restraint assembly that is attached to a support surface of a data center that supports the server rack; adjusting a position of a back side of the server rack into one of a plurality of unique positions along the rear restraint assembly so that the server rack is positioned between lateral members coupled to the rear restraint assembly that extend beyond the rear restraint assembly on sides of the server rack; positioning a rear portion of the server rack vertically underneath an angled bracket of the rear restraint assembly; and positioning a front restraint assembly, coupled to the support surface, vertically above a front portion of the server rack.

A first aspect combinable with the example implementation further includes receiving a force on the server rack; restraining the server rack against vertical movement caused by the force with the angled bracket and the front restraint assembly; and restraining the server rack against lateral movement caused by the force with the lateral members.

A second aspect combinable with any of the previous aspects further includes restraining the server rack against rotational movement caused by the force with the angled bracket and the front restraint assembly.

A third aspect combinable with any of the previous aspects further includes installing the front restraint assembly to the support surface adjacent a front side of the server rack.

In a fourth aspect combinable with any of the previous aspects, installing the front restraint assembly to the support surface includes attaching an anchor channel of the front restraint assembly to the support surface; positioning a front side of the server rack laterally adjacent the anchor channel; coupling a front bracket of the front restraint assembly to the anchor channel; attaching at least one shim plate to the front bracket; and adjusting the shim plate flush against the front portion of the server rack.

In a fifth aspect combinable with any of the previous aspects, attaching an anchor channel of the front restraint assembly to the support surface includes embedding the anchor channel in the support surface.

A sixth aspect combinable with any of the previous aspects further includes attaching each of the lateral members to a rear bracket of the rear restraint assembly independently of other lateral members.

In a seventh aspect combinable with any of the previous aspects, each of the rear restraint assembly and front restraint assembly is detached from the server rack when positioned.

In an eighth aspect combinable with any of the previous aspects, moving a server rack adjacent a rear restraint assembly includes moving the server rack into a specified position adjacent the rear restraint assembly without visual inspection of the specified position.

In a ninth aspect combinable with any of the previous aspects, the specified position includes a space defined between the lateral members.

In another example implementation, a server rack system includes a first restraint assembly attachable to a data center floor, the first restraint assembly configured to interface with a first side of a plurality of data center server racks exclusive of contact with the server racks; and a second restraint assembly attachable to the data center floor, the second restraint assembly configured to interface with a second side of the plurality of data center server racks exclusive of contact with the server racks. The first and second restraint assemblies contactingly engage the plurality of server racks, in response to a natural force applied to the plurality of server racks, to restrain vertical and lateral movement of server racks due to the natural force.

In a first aspect combinable with the example implementation, the natural force includes a seismic force.

In a second aspect combinable with any of the previous aspects, the first restraint assembly includes a plurality of server rack positions, each server rack position defined by one or more lateral restraints positioned on the first restraint assembly to receive a particular server rack of the plurality of server racks.

In a third aspect combinable with any of the previous aspects, the plurality of server rack positions are independently adjustable along the first restraint assembly.

In a fourth aspect combinable with any of the previous aspects, the two lateral restraints include guides to receive and position the particular server rack in a particular server rack position.

Various implementations of a data center server rack restraint may include one, some, or all of the following features. For example, a server rack restraint may allow a server rack to be restrained within a row of racks at any particular location within the row. As another example, the server rack restraint may allow for "blindly" positioning and coupling of a server rack to a rear anchor assembly, e.g., with no requirement for installer access to the rear anchor assembly. As another example, the server rack may be decoupled from the server rack restraint efficiently, e.g., without access to a rear anchor assembly. Further, the seismic restraint system may laterally and vertically restrain movement of a server rack during a seismic event or other event that exerts one or more forces or moments on the server rack. As yet another example, the server rack restraint may allow for a maximization of utilization of data center space by allowing "rack-to-rack" placement of multiple racks within a row.

The details of one or more embodiments are set forth in the accompanying drawings and the description below. Other features, objects, and advantages will be apparent from the description and drawings, and from the claims.

DETAILED DESCRIPTION

Figure 1:
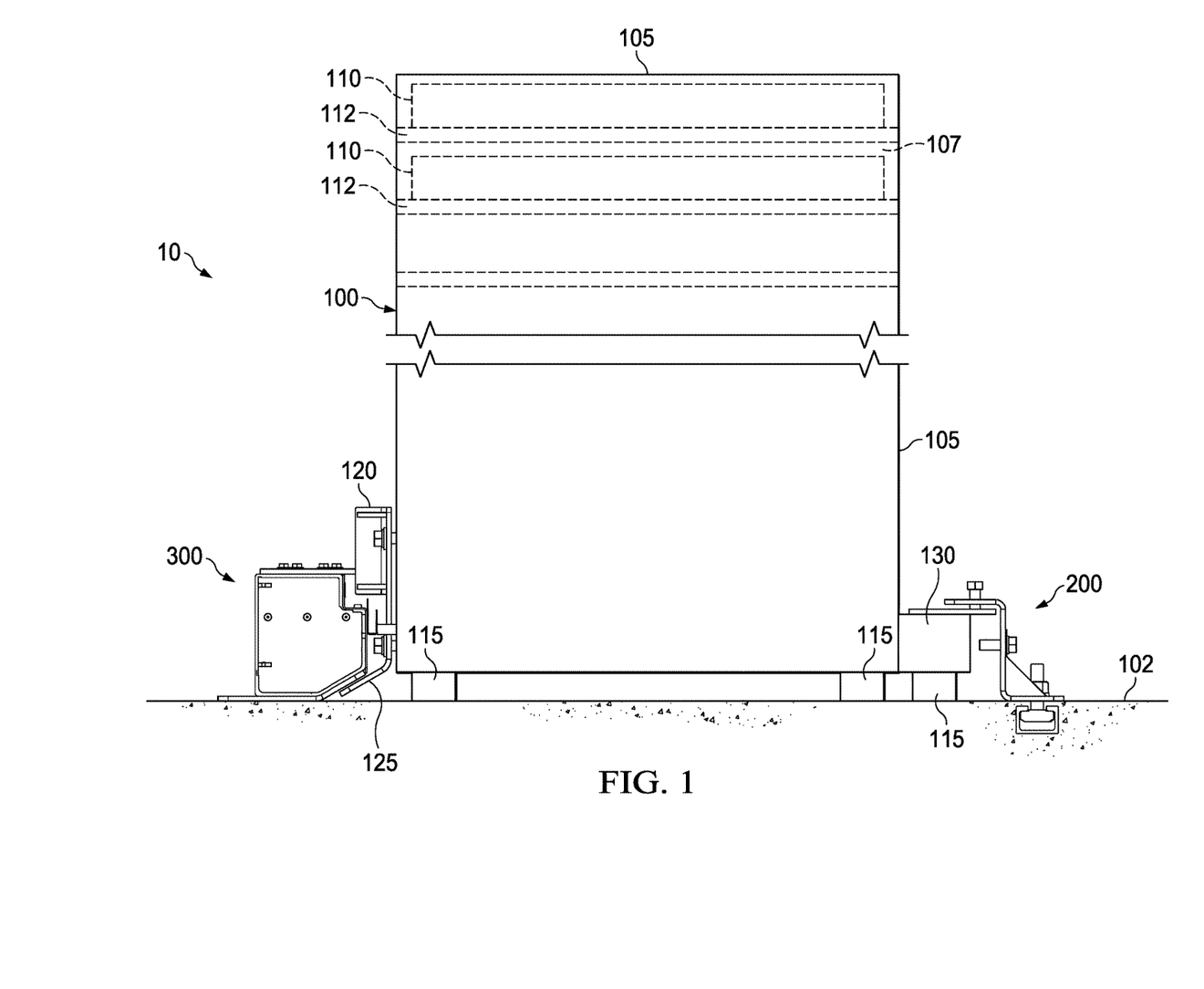
FIG. 1 illustrates a side view of a server rack system used in a data center environment that includes front and rear restraint assemblies.

FIG. 1 illustrates a side view of a server rack system 10 used in a data center environment that includes a front restraint assembly 200 and a rear restraint assembly 300. As shown in FIG. 1, the system 10 includes a server rack 100 positioned on a support surface 102 and restrained from movement (e.g., vertical, lateral, rotational, and otherwise) in response to, for example, seismic forces or other external forces that may act upon the server rack 100.

The server rack 100, e.g., a 13 inch or 19 inch server rack, includes multiple server rack sub-assemblies 110 mounted within a housing 105 of the server rack 100. Although a single server rack 100 is illustrated, server rack 100 may be one of a number of server racks within the system 100, which may include a server farm or a co-location facility that contains various rack mounted computer systems. Also, although multiple server rack sub-assemblies 110 are illustrated as mounted within the server rack 100, there might be only a single server rack sub-assembly. Generally, the server rack 100 defines multiple slots 107 that are arranged in an orderly and repeating fashion within the server rack 100, and each slot 107 is a space in the rack into which a corresponding server rack sub-assembly 110 can be placed and removed. For example, the server rack sub-assembly can be supported on rails 112 that project from opposite sides of the server rack 100, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the server rack 100, and where the slots are oriented vertically, they may be stacked horizontally in the server rack 100.

Server rack 100, as part of a larger data center for instance, may provide data processing and storage capacity. In operation, a data center may be connected to a network, and may receive and respond to various requests from the network to retrieve, process, and/or store data. In operation, for example, the server rack 100 typically facilitates the communication of information over a network with user interfaces generated by web browser applications of users who request services provided by applications running on computers in the datacenter. For example, the server rack 100 may provide or help provide a user who is using a web browser to access web sites on the Internet or the World Wide Web.

The server rack sub-assembly 110 may be one of a variety of structures that can be mounted in the server rack 100. For example, in some implementations, the server rack sub-assembly 110 may be a "tray" or tray assembly that can be slidably inserted into the server rack 100. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

The illustrated server rack 100 includes one or more rollers 115 coupled to the server rack 100 (e.g., to a housing 105 of the server rack 100) thus allowing for mobility of the rack 100. The rollers 115 may be wheels, casters, or otherwise that facilitates movement of the rack 100 across the support surface 102. The rollers 115, for example, may facilitate movement of the server rack 100 into position to engage the rear restraint assembly 300.

Figure 3A:
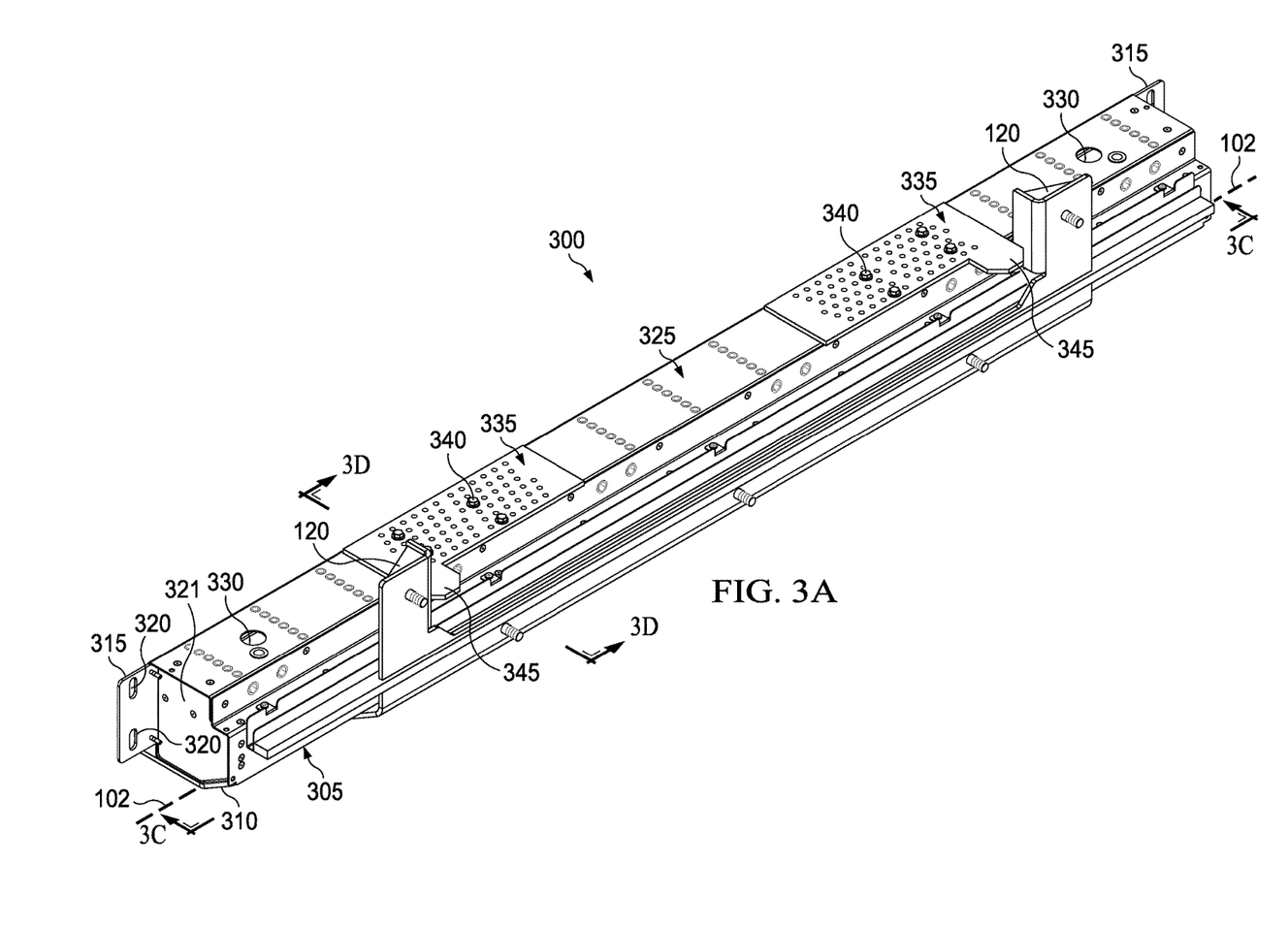
FIGS. 3A-3C illustrate schematic views of a rear restraint assembly for a server rack.

As illustrated in FIG. 1, a rack bracket 120 may be coupled to the housing 105 via fasteners 122. Although a single rack bracket 120 is shown in FIG. 1, two or more rack brackets 120 may be attached to, as shown, a lower portion of the housing 105 near a bottom surface of the rack 100. For instance, rack brackets 120 may be attached to a rear portion of the housing 105 close to or at sides of the rack 105. Each rack bracket 120, in some implementations, may be or may approximate an "L-shaped" structural member, such as shown in FIG. 3A. Alternatively, the rack bracket 120 may be any form of structural member that projects from the housing 105 of the server rack 100 to engage at least a portion of the rear restraint assembly 300.

The server rack 100 illustrated in FIG. 1 also includes a back stop 125 that is coupled to the housing 105 of the server rack 100. As shown in this figure, the back stop 125 is angled relative to vertical sides of the housing 105, thereby extending away from the vertical sides of the housing 105. In some implementations, the back stop 125 may extend along a width of the rear side of the housing 105. In some implementations, the back stop 125 may be positioned vertically under the rack bracket 120. For instance, in some implementations, the back stop 125 may be coupled with, or formed integrally with, the rack bracket 120 (e.g., as shown in FIG. 3A).

As further illustrated in the example implementation of FIG. 1, the server rack 100 includes a front edge 130 that extends from the lower portion of the housing 105. As illustrated, the front restraint assembly 200 is positioned so that a portion of the assembly 200 covers at least a portion of the front edge 130.

In this example implementation, the front and rear restraint assemblies 200 and 300 may restrain (e.g., prevent or substantially prevent) movement of the server rack 100 in response to a force or torque directed to the rack 100 (e.g., by a seismic event or otherwise). For example, the front restraint assembly 200 may restrain the server rack 100 from vertical movement (e.g., relative to the support surface 102) in the case of a seismic event. As another example, the front restraint assembly 200 may restrain the server rack 100 from rotational movement in the case of a seismic event. Also, the rear restraint assembly 300 may restrain the server rack 100 from vertical movement (e.g., relative to the support surface 102) and rotational movement in the case of a seismic event. The rear restraint assembly 300 may restrain the server rack 100 from lateral movement, as well, in the case of a seismic event.

FIGS. 2A-2D illustrate schematic views of the front restraint assembly 200 for a server rack. As described previously, the front restraint assembly 200 may be positioned to restrain vertical movement, rotational movement, or both of a server rack in a data center environment in response to, for instance, a seismic event. As illustrated in the isometric view of FIG. 2A, the front restraint assembly 200 includes a front bracket 205 that, in this implementation is formed of a z-member structure that includes a sidewall 215, a bottom member 220, and top wings 210.

Figure 2A:
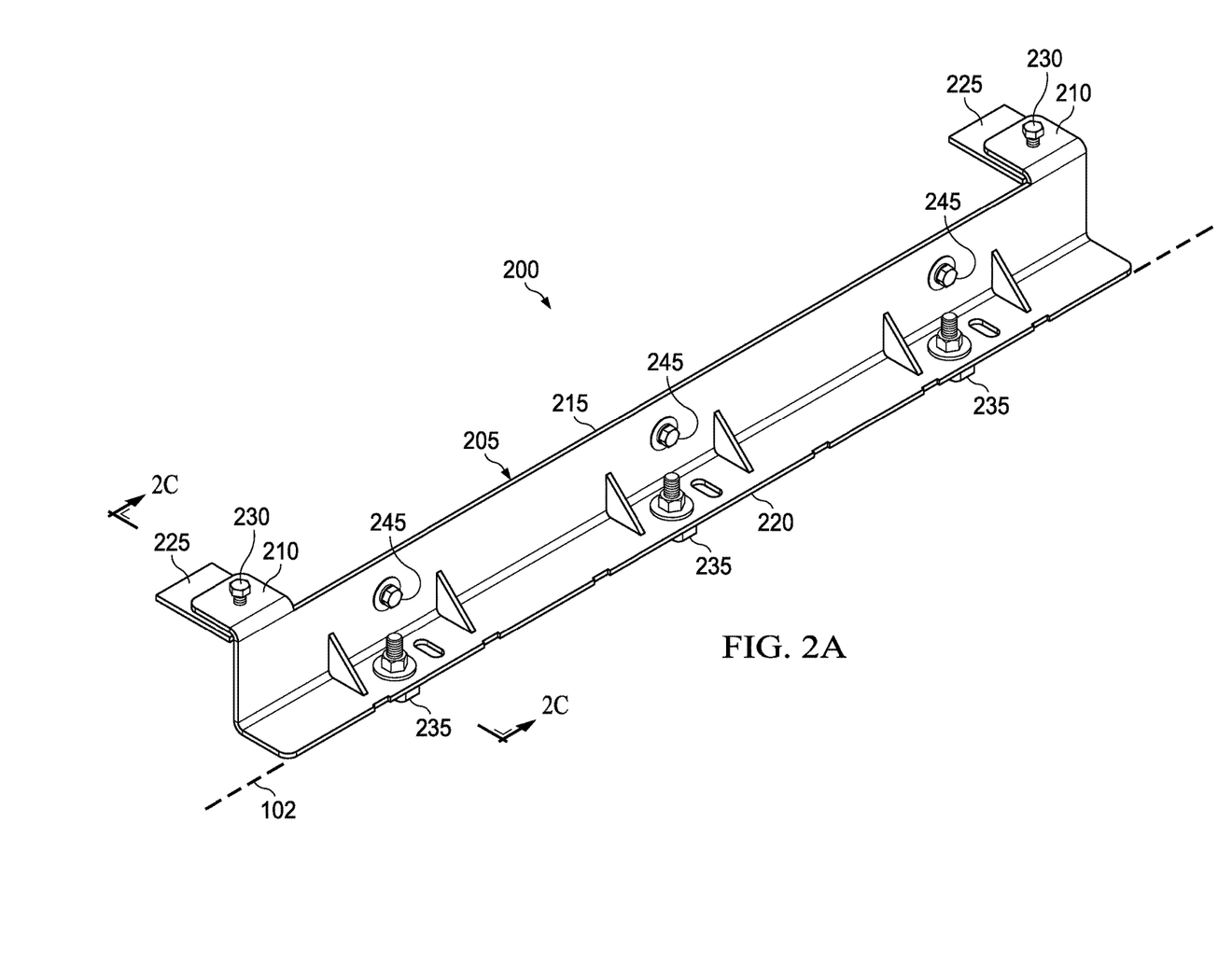
FIGS. 2A-2D illustrate schematic views of a front restraint assembly for a server rack.
Figures 2B, 2C, 2D:
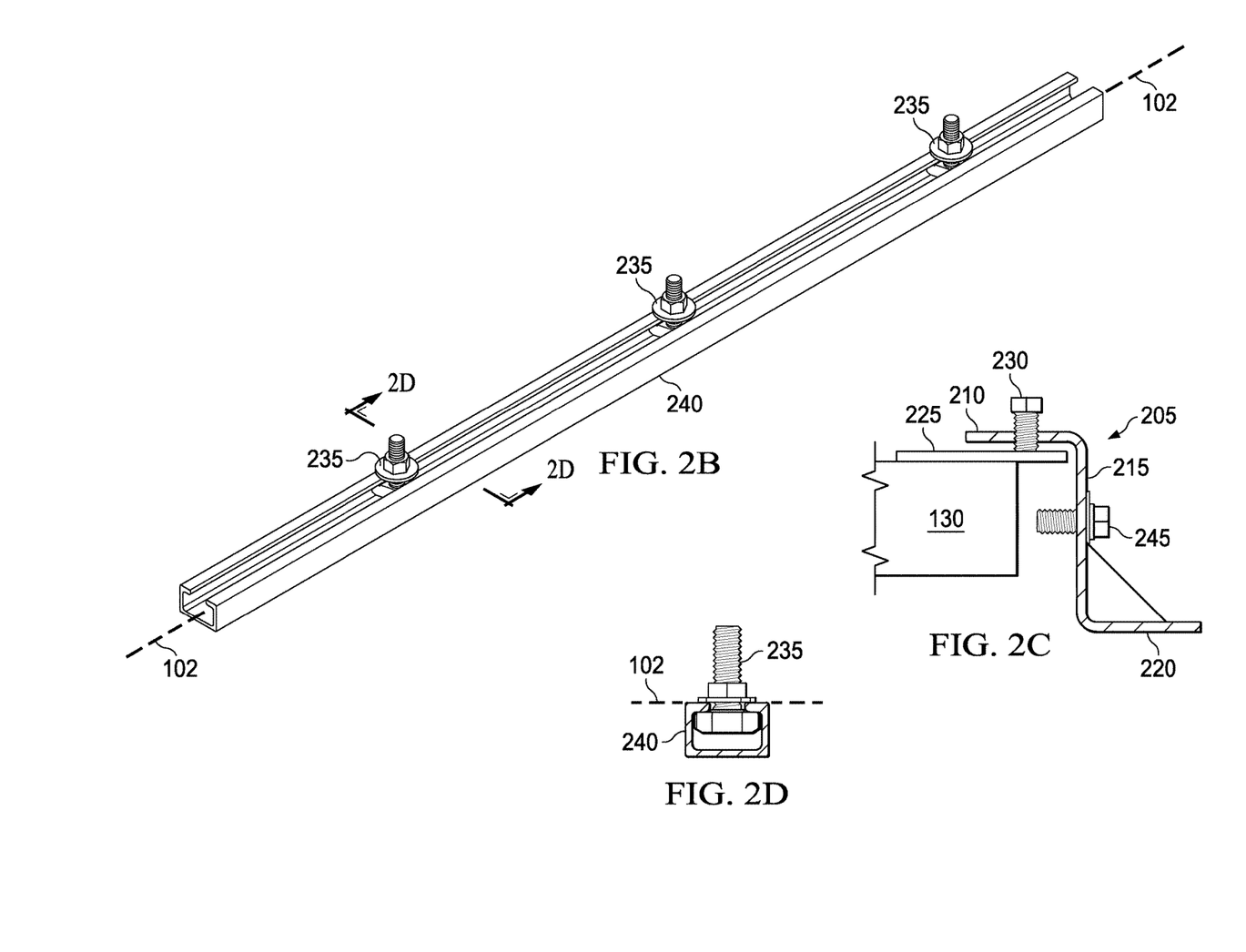

As shown in FIG. 2A, the bottom member 220 may rest on support surface 102 and be fastened (e.g., with fasteners 235, which can be bolt/nut assemblies, screws, rivets, or otherwise) to an anchor channel 240 that is illustrated in FIGS. 2B and 2D. The anchor channel 240 may be at least partially embedded in the support surface 102 prior to installation of the bottom member 220 over the fasteners 235. For example, the support surface 102 may be a concrete or other poured slab surface (e.g., gypsum or otherwise). During installation of the support surface 102, the anchor channel 240 may be positioned in the liquid or semi-solid material that hardens into the support surface 102. As another example, the support surface 102 may be a raised floor, onto a bottom surface of which the anchor channel 240 may be attached. As the bottom member 220 is positioned over the fasteners 235 and rigidly coupled to the anchor channel 240, forces applied to the front bracket 205 (e.g., from a server rack due to a seismic event) may be borne by the support surface 102, as well as the front restraint assembly 200.

As further illustrated in FIGS. 2A and 2C, the front restraint assembly 200 includes a shim plate 225 that is vertically positioned under each of the top wings 210. The shim plates 225 can be placed into contact with a portion of a server rack (e.g., the front edge 130 of the server rack 100) and attached to the top wings 210 with fasteners 230 (bolt/nut assemblies, screws, rivets, or otherwise). Once installed in contact with the portion of the server rack 100, the shim plates 225 may ensure or help ensure a flush contact between the front bracket 205 and the server rack.

Turning to FIG. 2C in particular, when the shim plates 225 are installed flush against the server rack 100, vertical movement of the rack 100 caused by, for example, seismic forces, is constrained by contacting interference between the plates 225 and rack 100 (e.g., front edge 130). For example, the shim plates 225 may restrain the server rack 100 from vertical and rotational movement (e.g., counterclockwise in FIG. 2C) by preventing (e.g., fully or substantially) the front edge 130 from moving upward (e.g., away from support surface 102) or rotating counterclockwise as forces are applied to the server rack 100.

As further illustrated in FIG. 2A, fasteners 245 (bolt/nut assemblies, screws, rivets, or otherwise) may be inserted through the sidewall 215 of the front bracket 205 to couple to a portion of the server rack, such as, for example, the front edge 130 of the rack 100. In some aspects, for instance, coupling of the sidewall 215 to the server rack with the fasteners 245 may be performed subsequent to tightening the shim plates 225 onto the front edge 130 of the server rack 100.

Figure 3B:
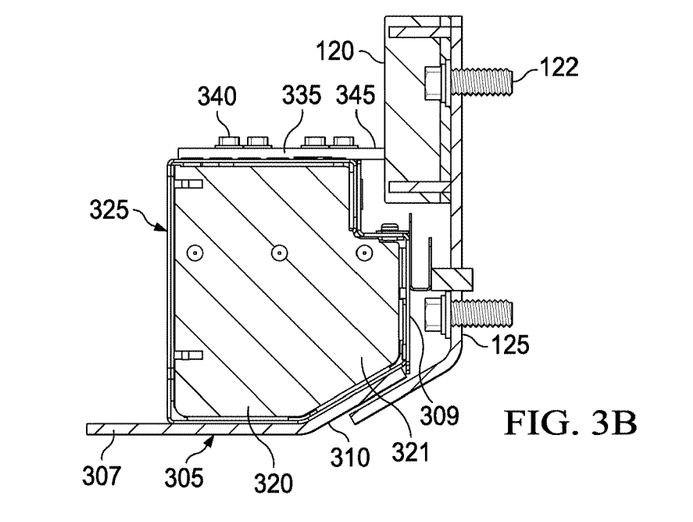
Figure 3C:
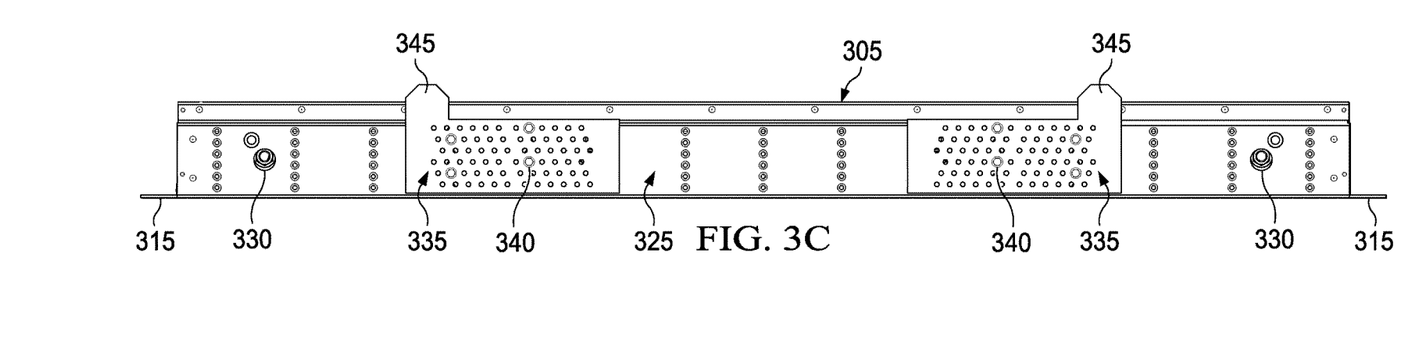

FIGS. 3A-3C illustrate schematic views of the rear restraint assembly 300 for a server rack, such as the server rack 100. As described previously, the rear restraint assembly 300 may be positioned to restrain vertical movement, rotational movement, lateral movement or a combination thereof of a server rack in a data center environment in response to, for instance, a seismic event. As illustrated in FIGS. 3A-3B, the rear restraint assembly 300 includes a rear bracket 305 that extends a length of the rear restraint assembly 300 and is shaped to include a bottom portion 307, an angled portion 310, and a side portion 309 that extends vertically from the angled portion 310. In some instances, the rear bracket 305 may be integrally formed with a single structural member, formed (e.g., on a metal brake or otherwise). In alternative aspects, the rear bracket 305 may be formed from two or more structural components, fastened (e.g., by screw, bolt, rivet, adhesive, or otherwise) together to form the rear bracket 305.

With further reference to FIGS. 3A-3B, the rear restraint assembly 300 further includes a rear channel 325 that couples (e.g., with a fastener, adhesive, or otherwise) with the rear bracket 305 to form the structural member of the rear restraint assembly 300. As illustrated, the rear channel 325 includes one or more apertures 330 through which the rear restraint assembly 300 may be coupled by fasteners (e.g., bolts, screws, or otherwise, not shown here) to, for example, the support surface 102 or a channel embedded in the support surface 102. For example, although not pictured in FIGS. 3A-3B, an anchor channel (similar to channel 240) may be embedded in the support surface 102, and the rear restraint assembly 300 may be coupled (e.g., through the apertures 330 in the rear channel 325) with the anchor channel. In alternative implementations, the rear restraint assembly 300 may be coupled (e.g., through the apertures 330 in the rear channel 325) directly to the support surface 102 (e.g., as a poured slab, raised floor, or otherwise). For example, the rear restraint assembly 300 may be secured directly to the support surface 102 through a fastener (e.g., bolt, screw, rivet or otherwise) through the bottom portion 307 of the rear bracket 305.

In the example implementation shown in FIGS. 3A-3C, the rear restraint assembly 300 includes lug plates 315 that include lug holes 320. In some aspects, the lug plates 315 may be formed (integrally) with an end cap 321 positioned at ends of the rear channel 325 and rear bracket 305. The lug holes 320 may be used, e.g., to lift or move the rear restraint assembly 300 (e.g., manually or mechanically).

With reference to FIGS. 3A and 3C, the implementation of the rear restraint assembly 300 includes one or more (in this example, two) lateral plates 335 that are coupled to a top surface of the reach channel 325 with fasteners 340 (e.g., bolts, screws, rivets, or otherwise). The lateral plates 335 may be attached to the top surface of the rear channel 325 (or in some cases, may be formed integrally with the rear channel 325). Further, each lateral plate 335 may be coupled to the top surface at any of multiple discrete locations (e.g., at ½", ¼", 1" increments or any suitable incremental distance) along the reach channel 325. As illustrated, each lateral plate 335 includes a lateral nub 345 that extends from the plate 335 and past an area defined by the top surface of the reach channel 325.

With reference to FIG. 3A particularly, the lateral nub 345 is illustrated in contacting engagement with the rack bracket 120 of the server rack 100. In particular, in the example implementation, the lateral plates 335 may be coupled to the reach channel 325 such that the lateral nubs 345 are positioned apart a distance less than a distance between the rack brackets 120. Thus, as the server rack 100 may be positioned against the rear restraint assembly 300, the rack brackets 120 are positioned just adjacent the lateral nubs 345.

As shown in FIG. 3B, the back stop 125 portion of the rack bracket 125 is angled to match (e.g., exactly or substantially) the angled portion 310 of the rear bracket 305. Thus, the angled portion 310 and back stop 125 may provide mating surfaces that contactingly engage (e.g., surface to surface) when the server rack 100 is moved into a position against the rear restraint assembly 300. In some aspects, interference between the angled portion 310 and the back stop 125 may constrain the server rack 100 against movement caused by, for example, seismic forces. For example, the angled portion 310 may restrain the server rack 100 from vertical movement by engaging the back stop 125 when upward (e.g., away from support surface 102) forces are applied to the server rack 100. In addition, interference between the angled portion 310 and the back stop 125 may constrain the server rack 100 against rotational movement caused by, for example, seismic forces. For example, the angled portion 310 may restrain the server rack 100 from rotational movement (e.g., clockwise in FIG. 3B) by engaging the back stop 125 when upward (e.g., away from support surface 102) forces are applied to the server rack 100.

Figure 4:
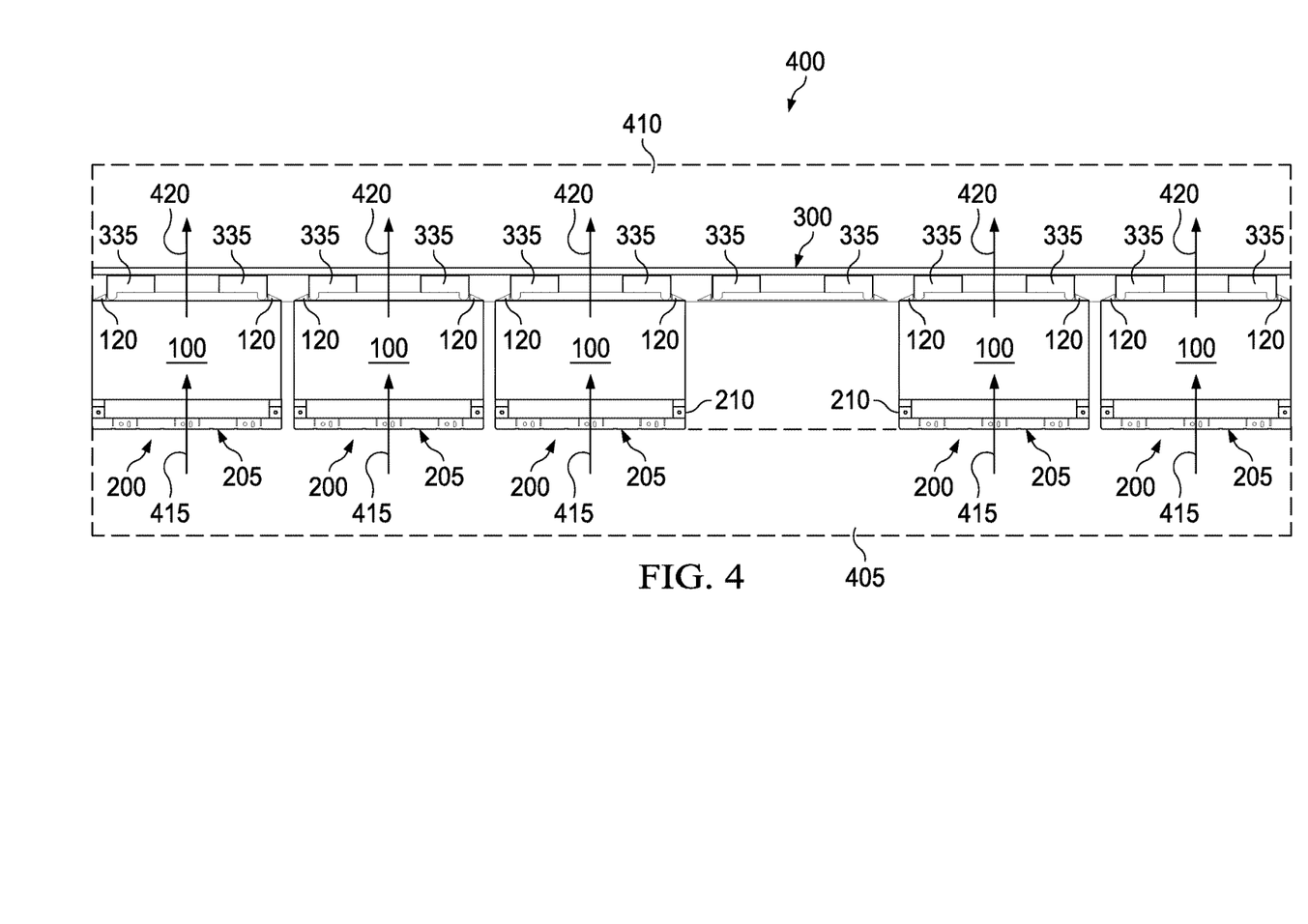
FIG. 4 illustrates a schematic top view of a data center environment that includes multiple server rack systems.

FIG. 4 illustrates a schematic top view of a data center environment 400 that includes multiple server rack systems 300. As shown in this figure, a row of server racks 100 is positioned between a cold aisle 405 and a warm aisle 410. The cold and warm aisles 405 and 410, respectively, are part of a human occupiable workspace of the data center environment, which may include power and communication equipment, as well as cooling equipment to cool heat-generating devices supported in the server racks 100. Generally, a cooling airflow 415 may be circulated (e.g., from cooling equipment in the data center environment 400) from the cold aisle 405 and through a front side of the server racks 100. As the cooling airflow 415 passes through the server racks 100, heat is transferred from the heat-generating devices to the cooling airflow 415, which exits a back side of the server racks 100. A warm airflow 420 exits into the warm aisle 410 (e.g., a warm air plenum). The warm airflow 420 is circulated back to the cooling equipment.

In this example implementation, the rear restraint assembly 300 is positioned between the warm aisle 410 and the server racks 100. In some aspects, the rear restraint assembly 300 may extend along the row of server racks 100 as a single, integrated component (e.g., with a single rear channel 325 and single rear bracket 305). Alternatively, there may be a multi-section rear restraint assembly 300 with, for example, multiple rear channels 325 and multiple rear brackets 305 formed (e.g., as shown in FIGS. 3A-3C) and positioned adjacently end-to-end.

Multiple lateral plates 335 (e.g., two per rack 100) may be positioned along the rear restraint assembly 300 as shown in FIG. 4. For example, depending on the intervals at which mounting holes 337 (shown in FIG. 3C) are placed on the rear channel(s) 325 in the rear restraint assembly 300, the lateral plates 335 may be mounted at multiple locations. By facilitating the mounting of the lateral plates 335 at multiple locations, the server racks 100 may be positioned along the rear restraint assembly 300 at multiple, adjustable locations as well. Thus, the server racks 100 may be positioned or moved to positions in which, for example, they may receive more cooling airflow 415, less cooling airflow 415, additional power, or otherwise. The positioning of the server racks 100 may therefore be independent of criteria such as, for example, an availability of specific rear anchor features, power supply locations, cooling equipment locations, positions of other server racks 100, data center building structure (e.g., columns), position or size of the warm air plenum or aisle 410, or otherwise.

As shown in FIG. 4, there may be multiple server racks 100 positioned substantially side-by-side (e.g., with minimal clearance between the racks 100). For example, the server racks 100 may be positioned side-by-side to achieve a high density of computing power, provided that sufficient cooling airflow 415 is available to cool the racks 100. In alternative examples, greater space may be provided between server racks 100 (e.g., as shown with a gap between racks 100 in FIG. 4) due to, for example, power or cooling requirements or deficiencies.

As illustrated in FIG. 4, front restraint assemblies 200 may be positioned at front sides of the server racks 100 to restrain the server racks as previously described. In some aspects, the front restraint assemblies 200 may be positioned and secured (e.g., to the support surface 102) to restrain movement of the server racks 100 (e.g., due to a seismic event). In this example, there is a one-to-one correspondence between front restraint assemblies 200 and server racks 100. In other example implementations, there may be more or fewer server racks 100 relative to front restraint assemblies 200.

Figure 5:
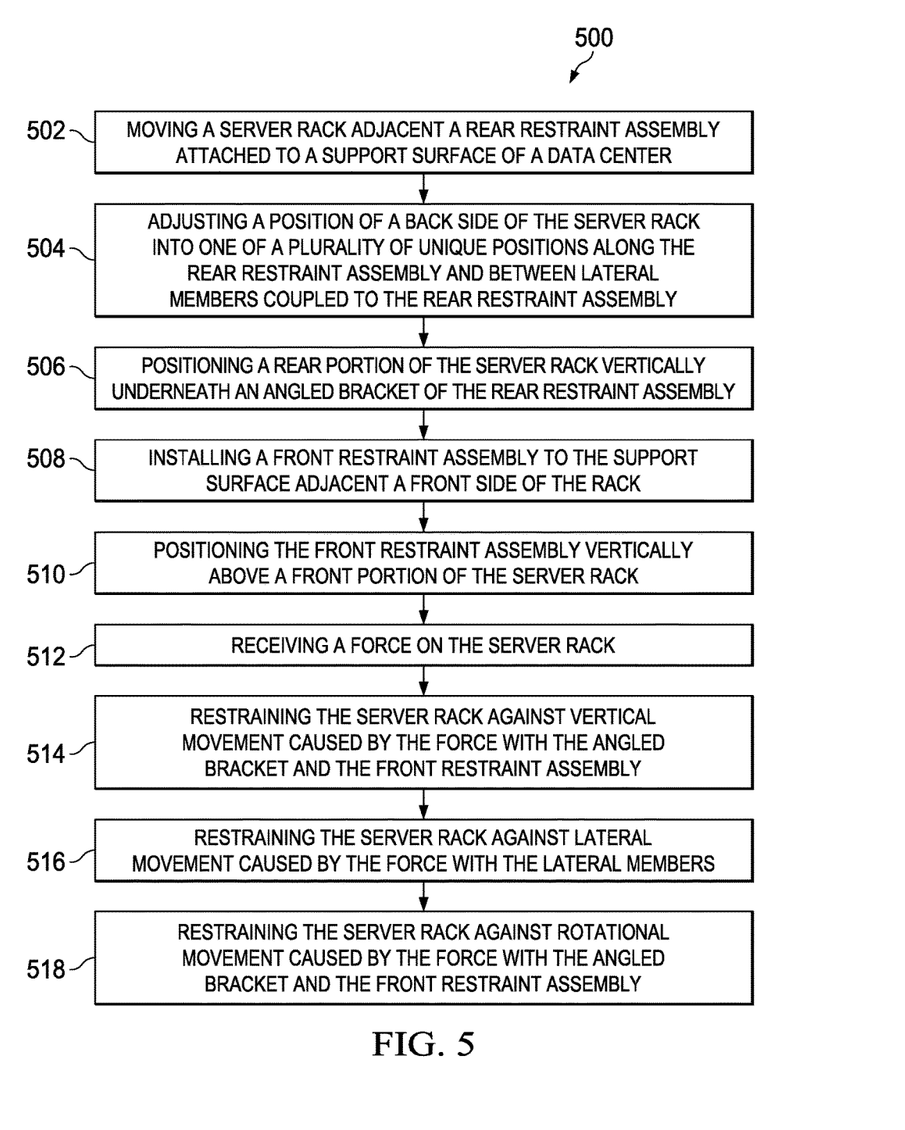
FIG. 5 illustrates a flowchart for a method for restraining a server rack in a data center.

FIG. 5 illustrates a flowchart for a method 500 for restraining a server rack in a data center. In some aspects, method 500 may be performed by or with the server rack 100, front restraint assembly 200, and rear restraint assembly 300 shown in FIGS. 1, 2A-2D, and 3A-3C. Method 500 may begin at step 502, which includes moving a server rack adjacent a rear restraint assembly attached to a support surface of a data center. In some aspects, moving the server rack includes moving the rack into a particular or specific position adjacent the rear restraint assembly, such as a space defined between lateral members of the rear restraint assembly. In some aspects, the lateral members may guide or help guide the server rack into the space, e.g., without any human visualization of the space. The lateral members may define the space and may be independently adjustable along the rear restraint assembly to define different spaces (e.g., different width spaces, different locations of the spaces, or both).

Method 500 may continue at step 504, which includes adjusting a position of a back side of the server rack into one of a plurality of unique positions along the rear restraint assembly and between lateral members coupled to the rear restraint assembly. For example, as the server rack is moved into position adjacent the rear restraint assembly, the back side of the rack may be positioned between the lateral members and against (but, in some aspects, not touching) the rear restraint assembly.

Method 500 may continue at step 506, which includes positioning a rear portion of the server rack vertically underneath an angled bracket of the rear restraint assembly. For example, as the rear portion of the server rack is positioned adjacent the rear restraint assembly, a portion of the server rack (e.g., a back stop attached to or part of the server rack) is positioned (e.g., angularly) underneath the angled bracket of the rear restraint assembly.

Method 500 may continue at step 508, which includes installing a front restraint assembly to the support surface adjacent a front side of the rack. In some aspects, installing the front restraint assembly includes attaching the anchor channel to the support surface; for example, the anchor channel may be at least partially embedded in a hardened floor (e.g., concrete slab) during curing of the floor. In alternative aspects, the front restrain assembly can be attached (e.g., with anchors) to a top surface of the support surface. The server rack may then be positioned in place (e.g., according to steps 502-506) so that the front side of the rack may be just adjacent the anchor channel. A front bracket may then be secured to the anchor channel.

Method 500 may continue at step 510, which includes positioning the front restraint assembly vertically above a front portion of the server rack. For example, shim plates or another portion of the front restraint assembly may be installed to the front bracket over a portion of the rack (e.g., a front edge). The shim plates (or other portion) may then be adjusted to be flush against the portion of the rack (e.g., touching the rack or near, but not touching the rack).

Method 500 may continue at step 512, which includes receiving a force on the server rack. The force may be a human-generated or machine-generated force that is unexpected or undesirable (e.g., accidental contact of the server rack with a machine such as a forklift). The force may also be a natural force, such as a force (or forces) generated by a seismic event (e.g., an earthquake).

Method 500 may continue at step 514, which includes restraining the server rack against vertical movement caused by the force with the angled bracket and the front restraint assembly. For example, as the force is applied to the server rack, vertical movement of the rack may be generated (e.g., through a support surface to the server rack). The front restraint assembly or rear restraint assembly, or both, may restrain (e.g., reduce or eliminate) the vertical movement of the server rack. For example, the shim plates of the front restraint assembly that are flush (e.g., in contact or not) with the server rack may restrain vertical movement. Also, or alternatively, the angled interference between the angled bracket and the back stop may restrain vertical movement of the server rack.

Method 500 may continue at step 516, which includes restraining the server rack against lateral movement caused by the force with the lateral members. For example, the lateral members may include portions that, when the server rack is positioned adjacent the rear restraint assembly, extend adjacent outer sides of the server rack. As the force urges the server rack to move side-to-side (e.g., laterally), the lateral members may restrain (e.g., reduce or eliminate) such movement.

Method 500 may continue at step 518, which includes restraining the server rack against rotational movement caused by the force with the angled bracket and the front restraint assembly. For example, as the force is applied to the server rack, rotational movement of the rack may be generated, tending to tip the server rack in one or more rotational directions (e.g., toward a front, toward a back, toward a side, or otherwise). The front restraint assembly or rear restraint assembly, or both, may restrain (e.g., reduce or eliminate) the rotational movement of the server rack. For example, the shim plates of the front restraint assembly that are flush (e.g., in contact or not) with the server rack may restrain rotational movement. Also, or alternatively, the angled interference between the angled bracket and the back stop may restrain rotational movement of the server rack.

A number of embodiments have been described. Nevertheless, it will be understood that various modifications may be made without departing from the spirit and scope of what is described. Accordingly, other embodiments are within the scope of the following claims.

What is claimed is:

1. A server rack seismic restraint, comprising:
  a rear restraint assembly configured to attach to a support surface that is operable to support a data center server rack, the rear restraint assembly comprising:
    at least two lateral members positioned to receive the server rack and restrain the server rack against lateral movement based on a force applied to the server rack, the at least two lateral members coupled with the rear restraint assembly at a distance apart to receive a width of the server rack, each of the at least two lateral members comprising a protrusion that extends from the rear restraint assembly to engage either a mating bracket attached to the rack or a side portion of the server rack; and
    an angled bracket positioned to receive the server rack and restrain the server rack against vertical movement based on the force applied to the server rack; and
  a front restraint assembly configured to attach to the support surface and engage the server rack to restrain the server rack against vertical movement based on the force applied to the server rack.

2. The server rack seismic restraint of claim 1, wherein the angled bracket is positioned to interface with the rear portion of the server rack to restrain the server rack against rotational movement based on the force applied to the server rack.

3. The server rack seismic restraint of claim 1, wherein the rear restraint assembly further comprises a rear bracket attachable to the support surface.

4. The server rack seismic restraint of claim 1, wherein each of the lateral members is independently attachable to the rear restraint assembly at a plurality of unique positions.

5. The server rack seismic restraint of claim 1, wherein the front restraint assembly comprises an anchor channel embeddable in the support surface.

6. The server rack seismic restraint of claim 5, wherein the support surface comprises a concrete slab.

7. The server rack seismic restraint of claim 5, wherein the front restraint assembly further comprises:
 a front bracket coupled to the anchor channel; and
 one or more shim plates coupled to the front bracket and adjustable to flush mount against a portion of the server rack to restrain the server rack against vertical movement and rotational movement based on the force applied to the server rack.

8. The server rack seismic restraint of claim 1, wherein each of the rear restraint assembly and front restraint assembly is detached from the server rack.

9. The server rack seismic restraint of claim 1, wherein the force comprises a seismic force.

10. A server rack system, comprising:
 a first restraint assembly attachable to a data center floor, the first restraint assembly configured to interface with a first side of a plurality of data center server racks exclusive of contact with the server racks; and
 a second restraint assembly attachable to the data center floor, the second restraint assembly configured to interface with a second side of the plurality of data center server racks exclusive of contact with the server racks, wherein
 the first and second restraint assemblies contactingly engage the plurality of server racks, in response to a natural force applied to the plurality of server racks, to restrain vertical and lateral movement of server racks due to the natural force,
 the first restraint assembly comprises at least two lateral members positioned at a distance apart to receive a width of at least one of the plurality of data center server racks, the first restraint assembly comprising a plurality of server rack positions, each server rack position defined between two adjacent lateral members of the at least two lateral members, and
 each of the at least two lateral members comprise a protrusion that extends from the first restraint assembly to engage either a mating bracket attached to the at least one data center server rack or a side portion of the at least one data center server rack.

11. The server rack system of claim 10, wherein the natural force comprises a seismic force.

12. The server rack system of claim 10, wherein the plurality of server rack positions are independently adjustable along the first restraint assembly.

13. The server rack system of claim 10, wherein the protrusions are configured to receive and position the particular server rack in a particular server rack position.

14. The server rack system of claim 10, wherein the first restraint assembly comprises a front restraint assembly attachable to the data center floor adjacent a front, open side of the data center server rack, and the second restraint assembly comprises a rear restraint assembly attachable to the data center floor adjacent a rear, open side of the data center server rack.

15. The server rack system of claim 14, wherein the front restraint assembly comprises an anchor channel embeddable in the data center floor.

16. The server rack system of claim 15, wherein the data center floor comprises a concrete slab.

17. The server rack system of claim 15, wherein the front restraint assembly further comprises:
 a front bracket coupled to the anchor channel; and
 one or more shim plates coupled to the front bracket and adjustable to flush mount against a portion of the data center server rack to restrain the data center server rack against vertical movement and rotational movement based on the natural force applied to the data center server rack.

18. The server rack system of claim 14, wherein each of the rear restraint assembly and front restraint assembly is detached from the data center server rack.

* * * * *

UNITED STATES PATENT AND TRADEMARK OFFICE
CERTIFICATE OF CORRECTION

| | | |
|---|---|---|
| PATENT NO. | : 10,412,854 B1 | |
| APPLICATION NO. | : 14/853561 | |
| DATED | : September 10, 2019 | |
| INVENTOR(S) | : Shaul et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 344 days.

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*